United States Patent
Kolics

(10) Patent No.: US 9,153,449 B2
(45) Date of Patent: Oct. 6, 2015

(54) ELECTROLESS GAP FILL

(75) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 59 days.

(21) Appl. No.: 13/424,135

(22) Filed: Mar. 19, 2012

(65) Prior Publication Data

US 2013/0244423 A1    Sep. 19, 2013

(51) Int. Cl.
| | | |
|---|---|---|
| H01L 21/44 | (2006.01) | |
| H01L 21/288 | (2006.01) | |
| H01L 21/768 | (2006.01) | |
| H01L 23/532 | (2006.01) | |

(52) U.S. Cl.
CPC ........ *H01L 21/288* (2013.01); *H01L 21/76877* (2013.01); *H01L 21/76883* (2013.01); *H01L 23/53233* (2013.01)

(58) Field of Classification Search
CPC ............ H01L 21/288; H01L 21/76877; H01L 21/76883; H01L 23/53233
USPC ............ 438/653; 427/558, 252, 305; 205/164
See application file for complete search history.

(56) References Cited

U.S. PATENT DOCUMENTS

| | | | |
|---|---|---|---|
| 3,310,430 A | | 3/1967 | Schneble et al. |
| 3,615,735 A | | 10/1971 | Shipley et al. |
| 4,009,297 A | * | 2/1977 | Redmond et al. ............. 427/558 |
| 4,617,205 A | * | 10/1986 | Darken ......................... 427/305 |
| 4,632,852 A | | 12/1986 | Akahoshi et al. |
| 4,818,286 A | | 4/1989 | Jagannathan et al. |
| 4,935,267 A | | 6/1990 | Kondo et al. |
| 4,970,107 A | | 11/1990 | Akahoshi et al. |
| 5,106,462 A | * | 4/1992 | Kawakami et al. ........... 205/164 |
| 6,042,889 A | * | 3/2000 | Ballard et al. ................. 427/305 |
| 6,793,779 B2 | * | 9/2004 | Ding et al. ............... 204/192.15 |
| 2004/0170766 A1 | | 9/2004 | Inoue et al. |
| 2004/0231997 A1 | * | 11/2004 | Wang et al. .................... 205/143 |
| 2005/0199489 A1 | | 9/2005 | Stevens et al. |
| 2006/0063382 A1 | | 3/2006 | Dubin et al. |
| 2007/0202254 A1 | * | 8/2007 | Ganguli et al. ............... 427/252 |
| 2008/0038452 A1 | | 2/2008 | Poole et al. |
| 2012/0264290 A1 | * | 10/2012 | Reid et al. ..................... 438/653 |

FOREIGN PATENT DOCUMENTS

| | | |
|---|---|---|
| KR | 10-2002000114 | 1/2002 |
| WO | WO 2009/051923 | 4/2009 |

OTHER PUBLICATIONS

Search Report dated Jun. 4, 2013 from International Application No. PCT/US2013/029993.
Written Opinion dated Jun. 4, 2013 from nternational Application No. PCT/US2013/029993.

* cited by examiner

*Primary Examiner* — Fernando L Toledo
*Assistant Examiner* — Mohammed Shamsuzzaman
(74) *Attorney, Agent, or Firm* — Beyer Law Group LLP

(57) ABSTRACT

A method for providing copper filled features is provided. Features are provided in a layer on a substrate. A simultaneous electroless copper plating and anneal is provided. The electroless copper plating is chemical-mechanical polished, where there is no annealing before the chemical-mechanical polishing and after the simultaneous electroless copper plating and anneal.

13 Claims, 3 Drawing Sheets

ELECTROLESS GAP FILL

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. This may be done by depositing copper or a copper alloy into features etched into the low-k dielectric layer. The deposited copper may be deposited by electrodeposition or by electroless deposition.

SUMMARY OF THE INVENTION

To achieve the foregoing and in accordance with the purpose of the present invention, a method for providing copper filled features is provided. Features are provided in a layer on a substrate. A simultaneous electroless copper plating and anneal is provided. The electroless copper plating is chemical-mechanical polished, where there is no annealing before the chemical-mechanical polishing and after the simultaneous electroless copper plating and anneal.

In another manifestation of the invention, a method for providing copper filled features is provided. Features are provided in a layer on a substrate. A liner is formed over the features in the layer. Material is removed from a bevel of the substrate after providing features in a layer on the substrate. A simultaneous electroless copper plating and anneal, which fills the features with copper deposit, is provided comprising providing a copper deposition bath, maintaining a temperature of the copper deposition bath at an anneal temperature of at least 80° C., and exposing the etched features to the copper deposition bath for anneal time of at least two minutes. The copper deposit is chemically mechanically polished where no annealing occurs after the simultaneous electroless copper plating and anneal and before the chemical-mechanical polishing.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Electroless plating of copper to fill etched features has advantages over electroplating of copper. Electroless plating is able to deposit metal on a thinner seed layer and does not suffer from ohmic potential drop because of the thin seed layer requirement. Electroless plating can easily scale to larger wafer diameters. In addition, electroless plating allows plating on the full face of the wafer and provides more versatility in workable liner materials, not only allowing for liners of cobalt (Co), ruthenium (Ru), and copper (Cu), but also allowing liners deposited by physical vapor deposition (PVD), chemical vapor deposition (CVD), and atomic layer deposition (ALD).

As the industry moves towards thinner features and thinner liner/seed/barrier, the advantages provided by electroless plating are more attractive. However, electroless plating has disadvantages when compared with electroplating. The main disadvantage is that electroless plating is significantly slower than electroplating. As a result, electroless plating tools have a lower throughput.

Electroplating may consist of different process modules and have multiple steps. Electroplating may start with a deionized water (DI) rinse, which is followed by electroplating, which is then followed by another DI rinse and then a metal edge removal process, followed by another DI rinse, and then an anneal. The mere replacement of electroplating by electroless deposition would result in a slower process. Therefore, an embodiment of the invention provides a faster electroless deposition process.

Figure 1:
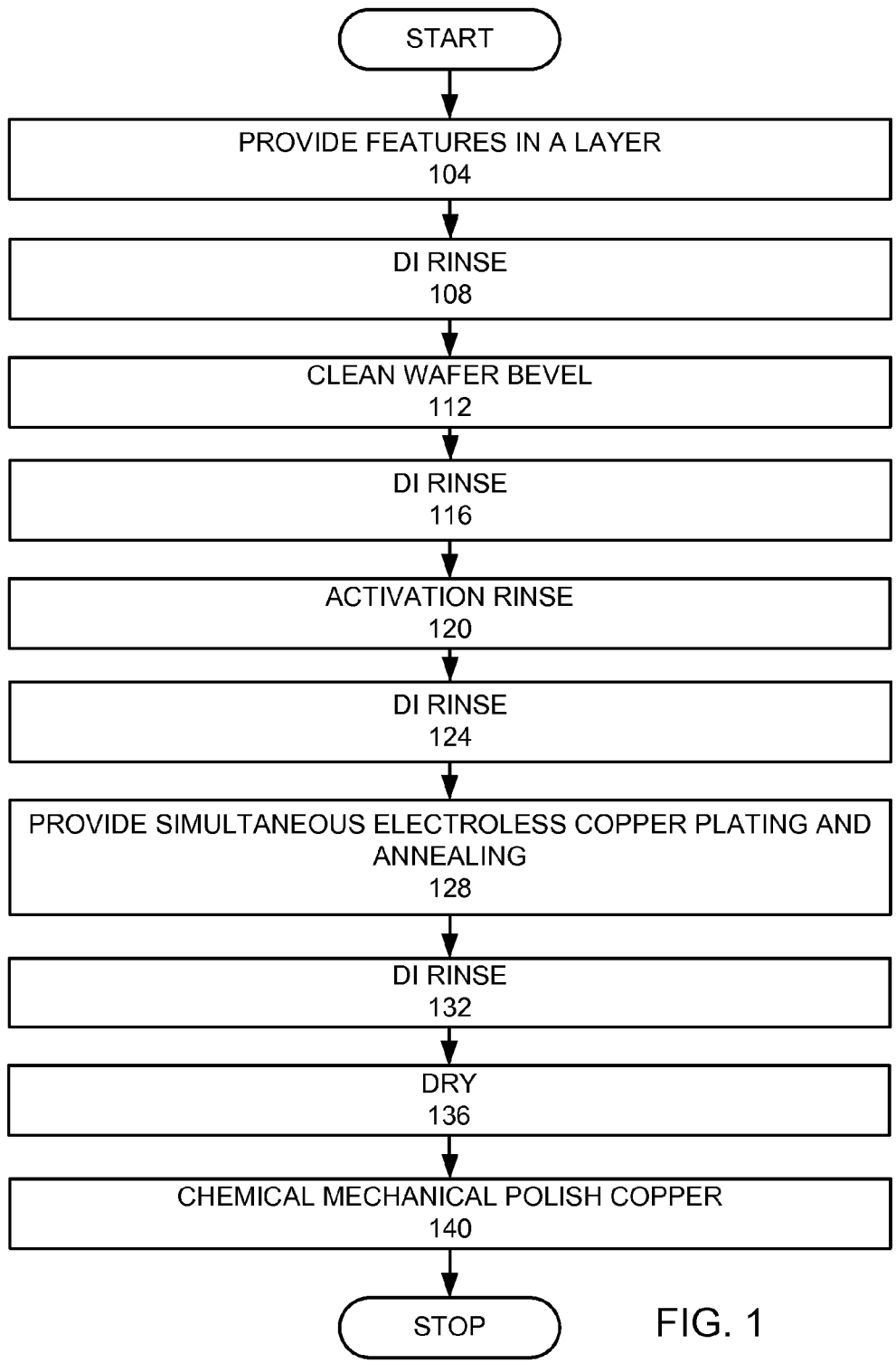
FIG. 1 is a flow chart of an embodiment of the invention.

FIG. 1 is a high level flow chart of an embodiment of the invention. In this embodiment, features are provided in a layer of a stack (step 104). If seed or barrier layers or other liners are desired in the features, they are formed in the features. The stack is subjected to a first DI rinse (step 108). The bevel on the wafer is cleaned to remove any deposit on the bevel (step 112). The stack is subjected to a second DI rinse (step 116). The stack is then subjected to an activation rinse (step 120). The stack is subjected to a third DI rinse (step 124). A simultaneous electroless copper plating and annealing is provided (step 128). The stack is subjected to a fourth DI rinse (step 132). The stack is dried (step 136). Chemical mechanical polishing (CMP) is used to polish the copper back to the tops of the features (step 140).

Figure 2:
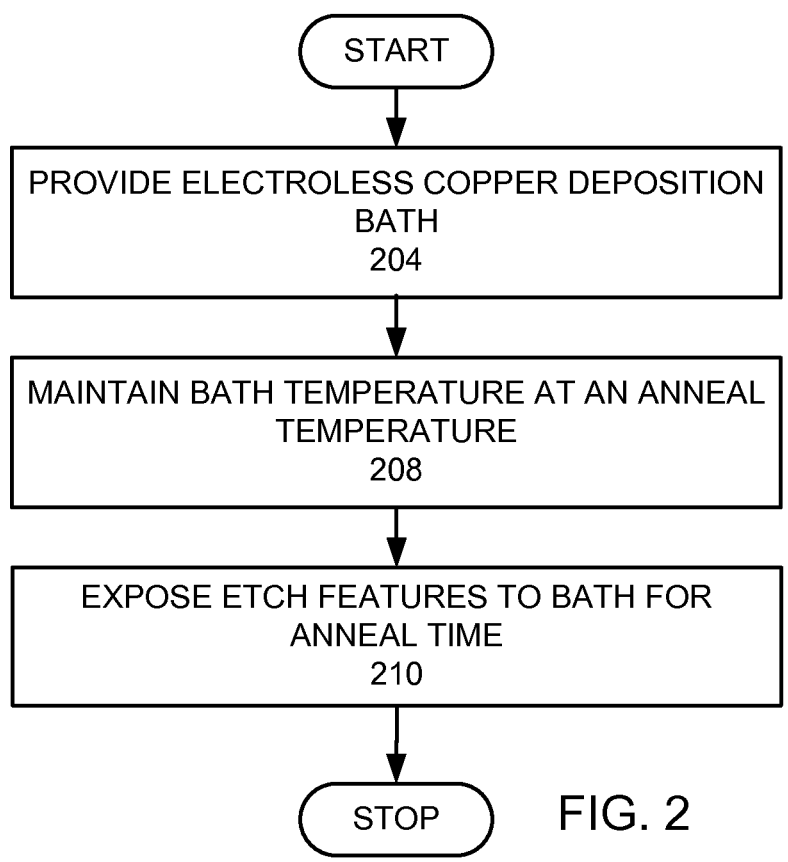
FIG. 2 is a more detailed flow chart of the step of providing a simultaneous electroless copper plating and annealing.

FIG. 2 is a more detailed flow chart of the step of providing a simultaneous electroless copper plating and annealing (step 128). An electroless copper deposition bath is provided (step 204). The bath is maintained at an anneal temperature (step 208). The etch features are exposed to the bath for an anneal time (step 210).

Figure 3A:
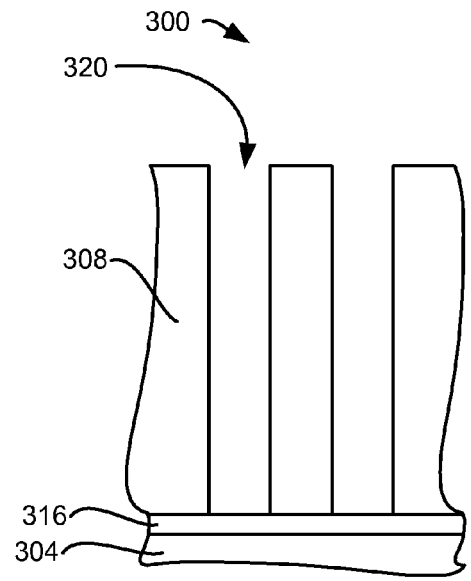
FIGS. 3A-D are schematic views of the formation of structures using the inventive process.

In a preferred embodiment of the invention, features are provided in a layer (step 104). FIG. 3A is a schematic cross-sectional view of a stack 300 with a substrate 304 with a layer 308 with features 320. In this example, one or more layers 316 are disposed between the substrate 304 and the layer 308. In this example the layer 308 with features 320 is a dielectric layer. More preferably, the layer 308 is a low-k dielectric layer, with a k value of less than 4.0. In this embodiment, the layer is organosilicate glass (OSG). The features may be formed by etching the layer 308.

Figure 3B:
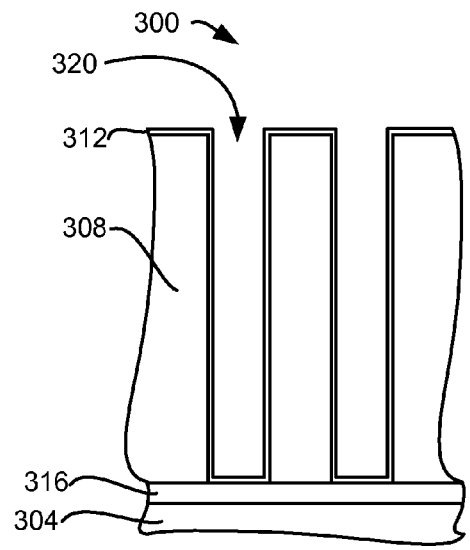

In this embodiment, a barrier layer and a seed layer 312 are formed in the features 320, as shown in FIG. 3B. They are shown as a single layer, due to the thinness of each layer, but are typically provided as two or more separate layers. In this embodiment the barrier layer is tantalum nitride (TaN). In addition, this embodiment has a seed layer of ruthenium or a copper alloy.

The stack 300 is subjected to a first DI rinse (step 108). The wafer bevel is cleaned to remove deposits on the wafer bevel. For an electroplating process, this may not be done before deposition, since a metal layer on the bevel may be used to provide an electrical connection. As a result, during electroplating, the metal layer on the bevel of the wafer may grow, which would increase the time it takes to clean the bevel. Since the metal layer on the bevel is removed before the electroless plating is performed, a metal layer does not grow during the electroless plating process, which allows a quicker bevel cleaning process. The stack is subjected to a second DI rinse (step 116). The stack is subjected to an activation rinse (step 120) to increase nucleation. The stack is subjected to a third DI rinse (step 124). In other embodiments, an activation rinse and the subsequent DI rinse are not used.

Figure 3C:
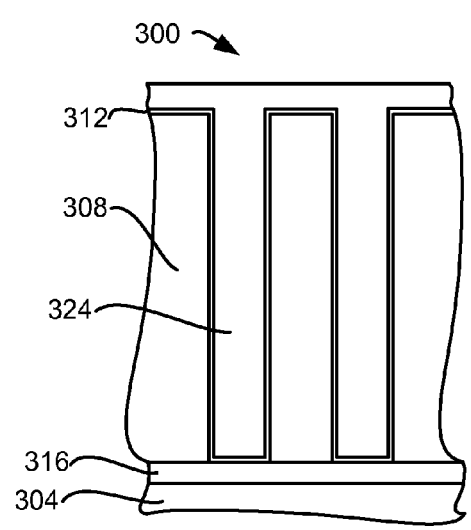

A simultaneous electroless copper plating and annealing is provided (step 128). An electroless copper bath is provided (step 204). In one embodiment, the copper bath provides a pure copper deposit. In other embodiments the copper bath provides a copper alloy. The alloying component may be one or more of silver, tin, cobalt, nickel, indium, ruthenium, rhenium, tungsten, molybdenum, palladium, gallium, germanium, zinc, or manganese. An example of an electroless copper bath comprises 0.06 M $CuCl_2$, 0.08 M ethylenediaminetetraacetate (EDTA), and 18 ml/L formalin. NaOH is used to adjust the pH of the bath to pH 12.5. The bath is maintained at an anneal temperature. In this embodiment of the invention, the anneal temperature is at least 80° C. The features are exposed to the electroless copper bath for an anneal time (step 210). In this embodiment the anneal time is at least 2 minutes. By providing the bath at an anneal temperature for an anneal time, the electroless copper plating and annealing are performed simultaneously. A faster process is provided compared to separately providing an electroless copper plating and annealing, which would take a longer time. In addition, the simultaneous copper plating and annealing may cause copper to reflow during the deposition process so that voids or seams are avoided. FIG. 3C is a schematic cross-sectional view of a stack 300 with a substrate 304 after the simultaneous copper plating and annealing are performed to form copper contacts 324 without voids or seams.

Figure 3D:
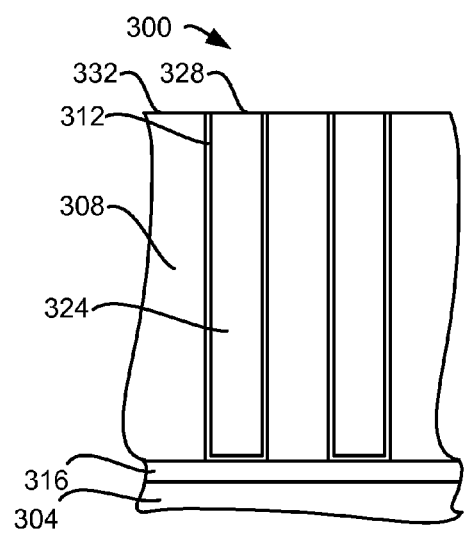

The stack is subjected to a fourth DI rinse (step 132). The stack is then dried (step 136). Isopropanol may be used for drying in one embodiment. Spinning may be used for drying in another embodiment. A chemical mechanical polishing (CMP) is provided to remove deposited copper over the layer 308 (step 140), without any annealing between the simultaneous electroless copper plating and annealing and the CMP. FIG. 3D is a schematic cross-sectional view of the stack 300 after the CMP is completed.

Another embodiment of the invention may provide a simultaneous electroless copper plating and anneal for a period of at least five minutes, where the temperature of the copper deposition bath is maintained at the anneal temperature during the entire period. More preferably, the simultaneous copper plating and anneal is performed for 5 to 15 minutes to provide larger copper grain sizes.

Preferably, the simultaneous electroless plating and anneal provides a bath at a temperature between 80° and 250° C. to provide a low temperature anneal. Preferably, the low temperature anneal is at a temperature sufficient to grow the copper grain sizes without distributing alloying metals. Other embodiments of the invention would provide baths with solvents with boiling points above the boiling point of water. This would allow the electroless plating bath to be maintained at a temperature between 100° C. and 250° C. For example, another embodiment of the invention maintains the bath at a temperature of between 150° C. and 200° C.

It has been found that providing a bath at an annealing temperature of at least 80° C. for an annealing time of at least two minutes provides sufficient annealing to grow large grains with reduced copper resistivity, so that an additional annealing is not needed. Therefore, additional annealing is not needed between the simultaneous electroless plating and anneal and the chemical mechanical polishing.

Providing a low temperature anneal before CMP provides grain growth without distributing alloying elements in the seed or other layers. Such processes may provide higher temperature annealing after CMP to melt an alloy component for distribution. However, the low temperature anneal before CMP is used to grow the copper grains before a higher temperature anneal after CMP distributes an alloy in the copper features. If the low temperature annealing is not provided first, then the high temperature annealing may distribute alloy through the copper features before grain growth, which would interfere with and reduce grain growth, which would increase resistance. In one example, a cap layer may be formed over the copper features, and then a high temperature anneal of at least 250° C. may be used to distribute an alloy material through the copper features. More preferably the high temperature anneal provides a temperature of at least 400° C.

An example of an electroplating process may use three electroplating chambers, five anneal chambers, and one or two CMP chambers. An embodiment of the invention may replace the three electroplating chambers and five anneal chambers with just five simultaneous electroless plating and anneal chambers.

As wafer sizes increase, the ohmic loss significantly increases as current paths between the bevel contact increases. As seed layer thicknesses decrease, ohmic loss further increases. Therefore, if a thin ruthenium seed layer is used for electroplating, the thin ruthenium seed layer may be highly resistive. The copper electroplating would run current from contacts on the wafer bevel over the surface of the wafer through the highly resistive thin ruthenium seed layer, which causes significant ohmic loss and would highly plate over the entire wafer surface. To overcome this, some electroplating processes use two different electroplating baths, which increases the complexity of the process. Because electroless plating does not require a current source, electroless plating avoids these problems.

In addition, since the embodiment of the invention cleans the bevel before the simultaneous electroless plating and anneal, only 40 Å of seed material is removed. In an electroplating process, which cleans the bevel after the electroplating, half a micron of material may be removed. Since this embodiment of the invention has more than 100 times less material to remove on the bevel, the time needed to clean the bevel is significantly reduced.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing copper filled features, comprising:
provided features in a layer on a substrate and forming at least one liner in the features composed of metal;
providing a simultaneous electroless copper plating and anneal, which fills the features with copper deposit, wherein the simultaneous electroless copper plating and anneal occurs in an electroless copper bath that is maintained at an anneal temperature and for an anneal time sufficient to perform the electroless copper plating and annealing simultaneously, such that the features are filled without the formation of voids or seams, wherein the anneal temperature of the electroless copper bath is between 150° C. and 250° C., wherein the electroless copper bath comprises one or more solvents having boiling points above the boiling point of water; and
chemical-mechanical polishing the copper deposit without an annealing after the simultaneous electroless copper plating and anneal and before the chemical-mechanical polishing; and
removing the metal from a bevel of the substrate after providing the features in a layer on the substrate and before providing the simultaneous electroless copper plating and anneal.

2. The method, as recited in claim 1, wherein the electroless copper bath is maintained at the anneal temperature for an anneal time that is at least two minutes.

3. The method, as recited in claim 2, further comprising providing a high temperature anneal at a temperature of at least 250° C. after chemical-mechanically polishing the copper deposit.

4. The method, as recited in claim 3, wherein the simultaneous electroless copper plating and anneal causes copper grains to grow.

5. The method, as recited in claim 4, wherein the simultaneous electroless copper plating and anneal does not distribute alloying components.

6. The method, as recited in claim 3, wherein the high temperature anneal distributes an alloying component.

7. The method, as recited in claim 3, further comprising forming a cap layer over the features after the chemical-mechanically polishing.

8. The method, as recited in claim 2, wherein the anneal time is between 5 and 15 minutes.

9. The method, as recited in claim 1 further comprising forming the at least one liner in the features before providing the simultaneous electroless copper plating and anneal.

10. The method, as recited in claim 9, wherein the at least one liner comprises a barrier layer.

11. The method, as recited in claim 9, wherein the at least one liner comprises a seed layer.

12. The method, as recited in claim 1, wherein the anneal time of exposure to the copper deposition bath is between 5 and 15 minutes.

13. A method for providing copper filled features, comprising:
providing features in a layer on a substrate and forming at least one liner in the features composed of metal;
providing a simultaneous electroless copper plating and anneal, which fills the features with copper deposit, wherein the simultaneous electroless copper plating and anneal occurs in an electroless copper bath that is maintained at an anneal temperature and for an anneal time sufficient to perform the electroless copper plating and annealing simultaneously, such that the features are filled without the formation of voids or seams, wherein the providing a simultaneous electroless copper plating and anneal comprises:
providing a copper deposition bath comprising one or more solvents having boiling points above the boiling point of water;
maintaining a temperature of the copper deposition bath at the anneal temperature; and
exposing the etched features to the copper deposition bath for the anneal time, wherein the anneal temperature of the copper deposition bath is between 150° C. and 250° C.; and
chemical-mechanical polishing the copper deposit without an annealing after the simultaneous electroless copper plating and anneal and before the chemical-mechanical polishing; and
removing the metal from a bevel of the substrate after providing the features in a layer on the substrate and before providing the simultaneous electroless copper plating and anneal.

* * * * *